United States Patent
Yu et al.

(10) Patent No.: US 10,131,540 B2
(45) Date of Patent: Nov. 20, 2018

(54) STRUCTURE AND METHOD TO MITIGATE SOLDERING OFFSET FOR WAFER-LEVEL CHIP SCALE PACKAGE (WLCSP) APPLICATIONS

(71) Applicant: Taiwan Semiconductor Manufacturing Co., Ltd., Hsin-Chu (TW)

(72) Inventors: Shao-Chi Yu, Hsinchu (TW);
Chia-Ming Hung, Taipei (TW);
Hsin-Ting Huang, Bade (TW);
Hsiang-Fu Chen, Zhubei (TW); Allen Timothy Chang, Hsinchu (TW);
Wen-Chuan Tai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 110 days.

(21) Appl. No.: 14/645,650

(22) Filed: Mar. 12, 2015

(65) Prior Publication Data
US 2016/0264402 A1    Sep. 15, 2016

(51) Int. Cl.
*G01P 15/08* (2006.01)
*B81C 1/00* (2006.01)
*B81B 7/00* (2006.01)

(52) U.S. Cl.
CPC .......... *B81C 1/0023* (2013.01); *B81B 7/007* (2013.01); *B81B 7/0048* (2013.01);
(Continued)

(58) Field of Classification Search
CPC ... B81C 1/0023; B81B 7/0051; G01L 9/0042; H01L 2224/16225; H01L 2224/16227;
(Continued)

(56) References Cited

U.S. PATENT DOCUMENTS 6,372,619 B1   4/2002   Huang et al.
6,454,160 B2   9/2002   Gueissaz
(Continued)

FOREIGN PATENT DOCUMENTS

CN   102315183 A   1/2012
CN   103534195 A   1/2014
(Continued)

OTHER PUBLICATIONS

Final Office Action dated Jun. 22, 2016 for U.S. Appl. No. 14/472,636.
(Continued)

*Primary Examiner* — Jesse Y Miyoshi
*Assistant Examiner* — Tuan A Hoang
(74) *Attorney, Agent, or Firm* — Eschweiler & Potashnik, LLC

(57) ABSTRACT

The present disclosure relates to a wafer level chip scale package (WLCSP) with a stress absorbing cap substrate. The cap substrate is bonded to a die through a bond ring and a bond pad arranged on an upper surface of the cap substrate. A through substrate via (TSV) extends from the bond pad, through the cap substrate, to a lower surface of the cap substrate. Further, recesses in the upper surface extend around the bond pad and along sidewalls of the bond ring. The recesses absorb induced stress, thereby mitigating any device offset in the die.

20 Claims, 11 Drawing Sheets

(52) U.S. Cl.
CPC .......... *B81B 7/0051* (2013.01); *B81B 7/0054* (2013.01); *H01L 2224/04026* (2013.01); *H01L 2224/05624* (2013.01); *H01L 2224/05644* (2013.01); *H01L 2224/16225* (2013.01); *H01L 2224/2957* (2013.01); *H01L 2224/29624* (2013.01); *H01L 2224/29644* (2013.01)

(58) Field of Classification Search
CPC . H01L 2224/16238; H01L 2224/16235; H01L 2224/08151; H01L 2224/08221; H01L 2224/08167; H01L 2224/01868; H01L 2224/29009; H01L 2224/32056; H01L 2224/05011; H01L 2224/05017; H01L 2224/05009
See application file for complete search history.

(56) References Cited

U.S. PATENT DOCUMENTS

| | | | |
|---|---|---|---|
| 6,465,271 B1 | 10/2002 | Ko | |
| 6,936,918 B2 | 8/2005 | Harney et al. | |
| 7,030,494 B2 | 4/2006 | Aoki | |
| 7,456,497 B2* | 11/2008 | Higashi | B81B 7/007 257/678 |
| 7,659,150 B1 | 2/2010 | Monadgemi et al. | |
| 7,821,085 B2* | 10/2010 | Suzuki | B81B 7/007 257/414 |
| 8,043,897 B2* | 10/2011 | Lee | B81B 7/0061 257/416 |
| 8,497,557 B2 | 7/2013 | Tanaka et al. | |
| 8,507,358 B2 | 8/2013 | Chou | |
| 8,525,278 B2 | 9/2013 | Chu et al. | |
| 8,569,090 B2* | 10/2013 | Taheri | B81B 7/007 438/456 |
| 8,575,748 B1* | 11/2013 | Farino | H01L 23/10 257/704 |
| 8,587,077 B2* | 11/2013 | Chen | B81C 1/00238 257/254 |
| 8,598,714 B2* | 12/2013 | Huisinga | H01L 21/76898 257/774 |
| 8,647,963 B2 | 2/2014 | Lee et al. | |
| 8,716,051 B2 | 5/2014 | Lin et al. | |
| 8,716,852 B2 | 5/2014 | Shu et al. | |
| 8,729,646 B2 | 5/2014 | Chu et al. | |
| 8,779,559 B2* | 7/2014 | Ramachandran | H01L 21/76898 257/531 |
| 8,866,238 B2 | 10/2014 | Classen | |
| 9,227,841 B2 | 1/2016 | Huang et al. | |
| 2005/0044953 A1* | 3/2005 | Yamaguchi | B81B 7/0051 73/488 |
| 2005/0250253 A1 | 11/2005 | Cheung | |
| 2006/0144142 A1 | 7/2006 | Gogoi | |
| 2009/0108381 A1 | 4/2009 | Buchwalter et al. | |
| 2010/0006959 A1 | 1/2010 | Kim et al. | |
| 2010/0273286 A1 | 10/2010 | Liang et al. | |
| 2010/0289140 A1* | 11/2010 | Sunohara | H01L 21/6835 257/737 |
| 2012/0025389 A1 | 2/2012 | Chu et al. | |
| 2012/0098074 A1 | 4/2012 | Lin et al. | |
| 2012/0125747 A1 | 5/2012 | Chu et al. | |
| 2012/0248615 A1 | 10/2012 | Chien et al. | |
| 2013/0043510 A1 | 2/2013 | Shu et al. | |
| 2013/0093084 A1 | 4/2013 | Chen et al. | |
| 2013/0105923 A1 | 5/2013 | Yu et al. | |
| 2013/0127036 A1 | 5/2013 | Kuo et al. | |
| 2013/0213139 A1 | 8/2013 | Chen et al. | |
| 2013/0214400 A1 | 8/2013 | Shu et al. | |
| 2013/0277777 A1 | 10/2013 | Chang et al. | |
| 2014/0042562 A1 | 2/2014 | Chu et al. | |
| 2014/0117475 A1 | 5/2014 | Classen et al. | |
| 2014/0203421 A1 | 7/2014 | Shu et al. | |
| 2014/0217521 A1* | 8/2014 | Johari-Galle | B81C 1/00134 257/415 |
| 2014/0227816 A1 | 8/2014 | Zhang | |
| 2015/0035089 A1 | 2/2015 | Liu et al. | |
| 2015/0175406 A1 | 6/2015 | Lin et al. | |
| 2015/0175407 A1 | 6/2015 | Cheng et al. | |
| 2015/0197419 A1 | 7/2015 | Cheng et al. | |
| 2015/0329351 A1 | 11/2015 | Cheng et al. | |
| 2017/0096331 A1* | 4/2017 | Classen | B81B 7/0048 |

FOREIGN PATENT DOCUMENTS

| | | |
|---|---|---|
| CN | 103824758 A | 5/2014 |
| CN | 103972191 A | 8/2014 |
| CN | 103988294 A | 8/2014 |

OTHER PUBLICATIONS

Notice of Allowance dated Aug. 12, 2016 U.S. Appl. No. 14/276,445.
Notice of Allowance dated Oct. 3, 2016 U.S. Appl. No. 14/472,636.
Non Final Office Action dated Jan. 12, 2016 U.S. Appl. No. 14/472,636.
Fan, et al. "Low Temperature Wafer-Level Metal Thermo-Compression Bonding Technology for 3D Integration." InTech, published in 2012.
Lu, et al. "Mechanisms Underlying the Unstable Contact Resistance of Conductive Adhesives." IEEE Transactions on Electronics Pacjaging Manufacturing, vol. 22, No. 3, Jul. 1999.
Fukuta, et al. "Vapor Hydrofluoric Acid (HF) Sacrificial Release Technique for MEMS Using Labware." Japanese Journal of Applied Physics. Jan. 2003.
U.S. Appl. No. 14/225,733 filed with the USPTO dated Mar. 26, 2014.
U.S. Appl. No. 14/276,445, filed May 13, 2014.
U.S. Appl. No. 14/472,636, filed Aug. 29, 2014.
Non Final Office Action dated Apr. 18, 2016 U.S. Appl. No. 14/276,445.
Non-Final Office Action dated Jan. 30, 2018 in connection with U.S. Appl. No. 15/406,915.
Final Office Action dated Aug. 27, 2018 in connection with U.S. Appl. No. 14/645,650.

* cited by examiner

STRUCTURE AND METHOD TO MITIGATE SOLDERING OFFSET FOR WAFER-LEVEL CHIP SCALE PACKAGE (WLCSP) APPLICATIONS

BACKGROUND

Microelectromechanical systems (MEMS) devices, such as accelerometers, pressure sensors, gyroscopes, etc., have found widespread use in many modern day electronic devices. For example, MEMS accelerometers are commonly found in automobiles (e.g., in airbag deployment systems), tablet computers, and smart phones. In recent years, it is increasingly common for MEMS devices to be incorporated into integrated circuits formed by a complementary metal-oxide-semiconductor (CMOS) process. The incorporation of MEMS devices (e.g., sensors, integrated optics, biochips, etc.) into a CMOS process allows for widespread use of MEMS devices fabricated with a high throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
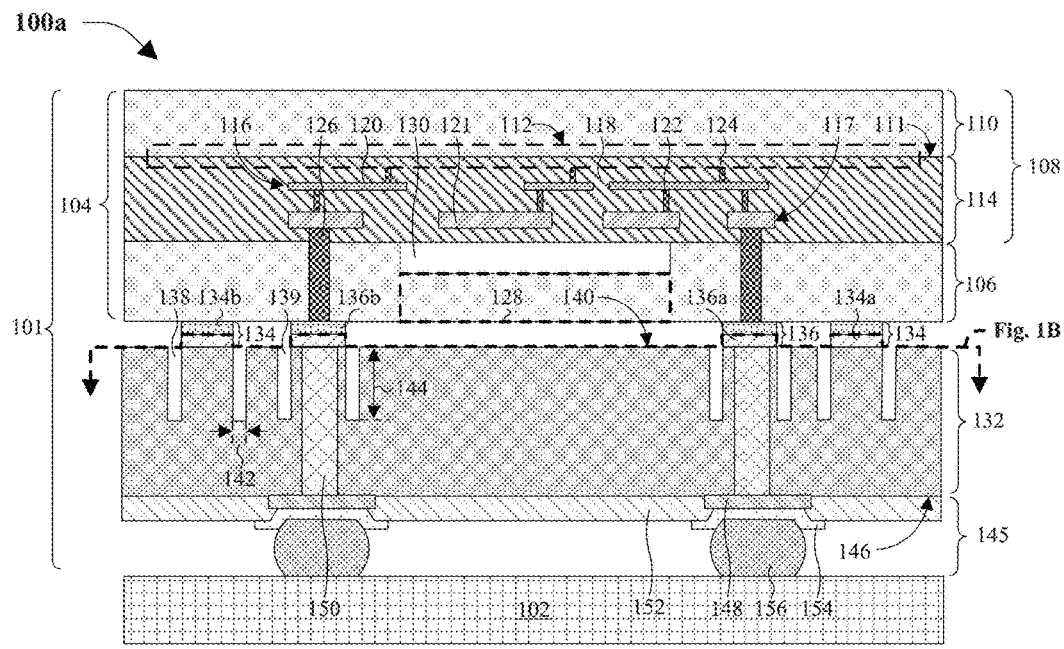
FIG. 1A illustrates a cross-sectional view of some embodiments of a wafer level chip scale package (WLCSP) with a stress absorbing cap substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "second", etc. may be used herein for ease of description to distinguish between different elements of a figure or a series of figures. "first", "second", "second", etc. are not intended to be descriptive of the corresponding element. Therefore, "a first dielectric layer" described in connection with a first figure may not necessarily corresponding to a "first dielectric layer" described in connection with another figure.

Modern day electronic devices are increasingly incorporating microelectromechanical systems (MEMS) devices into integrated circuits. The integration may provide for lower parasitics (e.g., lower resistance, inductance, and/or capacitance), lower cost, and/or increased performance. One approach for incorporating MEMS devices into integrated circuits is to package the MEMS devices and the integrated circuits as wafer-level chip scale packages (WLCSP). Such packaging is advantageous in that it can reduce packaging and integration costs.

In the formation of WLCSPs, a MEMS/CMOS wafer is provided or otherwise formed. For example, a MEMS wafer is bonded to a CMOS wafer. Through substrate vias (TSVs) are then formed within the CMOS wafer. Further, a ball grid array (BGA) is formed on a backside of the CMOS wafer and in electrical communication with the TSVs. The MEMS/CMOS wafer may be sawed or diced into chips, and the chips may be bonded or otherwise mounted onto other substrates. For example, an individual chip may be soldered onto a printed circuit board (PCB) using solder balls of the BGA.

A challenge with forming a WLCSP as described above is that soldering the WLCSP to a PCB induces a stress between the PCB and the WLCSP. A soldering process involves high temperatures (e.g., about 200-500 degrees Celsius). Due to a mismatch between thermal expansion coefficients of the PCB and the WLCSP (e.g. silicon of the WLCSP), the soldering process induces a stress between the WLCSP and the PCB. This induced stress gets transferred, through the solder balls and the CMOS die, to the MEMS die and causes a MEMS device offset that negatively affects device performance. For example, due to the MEMS device offset, the MEMS device may record and/or output a signal (e.g., a change in pressure signal) during zero point calibration or when no signal is expected.

In view of the foregoing, the present application is directed to a WLCSP with a cap substrate arranged along an induced stress path between a BGA and a MEMS/CMOS die. Recessions are arranged within the cap substrate to absorb induced stress along the induced stress path, and therefore prevent the transfer of the induced stress to the MEMS/CMOS die. Further, conductive interconnect structures or TSVs are disposed within the cap substrate for providing electrical connection between a PCB or other substrate underlying the WLCSP and the MEMS/CMOS die. Advantageously, the recesses absorb induced stress during soldering and prevent MEMS device offset, which improves device performance.

FIG. 1A illustrates a cross-sectional view 100a of some embodiments of a WLCSP 101 for reducing stress between the WLCSP 101 and a device substrate 102 to which the WLCSP 101 is bonded. Typically, the device substrate 102 is a PCB and the WLCSP 101 is bonded to the PCB through solder balls. However, other substrate types and/or bonding processes are amenable. The WLCSP 101 includes a die 104. Typically, the die 104 includes one or more of a MEMS structure 106 and an integrated circuit (IC) 108. For example, as illustrated, the die 104 may include the IC 108 arranged over the MEMS structure 106. However, the die 104 may include or be otherwise be limited to additional or alternative semiconductor structures.

The IC 108 includes an IC substrate 110, a device region 112, and a back-end-of-line (BEOL) metallization stack 114. The device region 112 underlies the IC substrate 110 and extends into a lower surface 111 of the IC substrate 110. The device region 112 includes electronic components, such as resistors, capacitors, transistors, etc. In some embodiments, the electronic devices are CMOS devices. The BEOL metallization stack 114 underlies the IC substrate 110 and abuts the IC substrate 110 and the device region 112. The BEOL metallization stack 114 includes a plurality of metallization layers 116, 117 stacked within an interlayer dielectric layer 118. The metallization layers 116, 117 include metal lines 120 and/or bond pads 121. One or more vias 122 of the BEOL metallization stack 114 extend between the metallization layers 116, 117 to interconnect the metallization layers 116, and one or more contacts 124 of the BEOL metallization stack 114 extend between a metallization layer 116 residing closest to the device region 112 and the device region 112. The interlayer dielectric layer 118 may be, for example, a low κ dielectric or an oxide. The metallization layers 116, the contacts 124, and the first vias 122 may be, for example, a metal, such as copper, aluminum, or tungsten.

The MEMS structure 106 includes, in some embodiments, one or more first, through substrate vias 126 extending through the MEMS structure 106 to the metallization layers 116, 117 of the IC 108. The MEMS structure 106 typically corresponds to a pressure sensor, but the MEMS structure 106 may correspond to other types of MEMS devices, such as motion sensors.

Where the MEMS structure 106 corresponds to a pressure sensor, the MEMS structure 106 includes a flexible membrane 128 (demarcated by a dashed box). The flexible membrane 128 includes a first surface abutting an underlying or overlying cavity 130, and a second surface, opposite the first surface, that is in fluid communication with an external environment. The cavity 130 is hermetically sealed with a reference pressure. For example, an opening in the MEMS structure 106 may be sealed by the IC 108 to define the cavity 130. In operation, the flexible membrane 128 deflects in proportion to the difference between the reference pressure and a pressure of the external environment. Hence, by measuring the deflection, the environmental pressure can be measured. In some embodiments, the deflection is measured by capacitive coupling between one or more sensing electrodes (not shown) arranged in the flexible membrane 128, or otherwise arranged on the flexible membrane 128, and neighboring bond pads 121 of the IC 108.

A cap substrate 132 of the WLCSP 101 underlies the die 104. The cap substrate 132 is bonded to the die by way of one or more bonding elements. In some embodiments, the one or more bonding elements may eutectically bond the cap substrate 132 to the die 104 through bond rings 134 and bond pads 136 arranged between the die 104 and the cap substrate 132. The bond rings 134 include a cap bond ring 134a and a die bond ring 134b respectively arranged on the cap substrate 132 and the die 104. The bond pads 136 include cap bond pads 136a and die bond pads 136b respectively arranged on the cap substrate 132 and the die 104. The die bond pads 136b are typically coupled electrically to the first, through substrate vias 126.

A plurality of recesses 138, 139 are arranged within an upper surface of the cap substrate 132 facing the MEMS structure 106. The plurality of recesses 138, 139 are arranged at positions around the one or more bonding elements. For example, the recesses 138, 139 within the cap substrate 132 may extend around the cap bond pads 136a and along sidewalls of the cap bond ring 134a within an upper surface 140 of the cap substrate 132. In some embodiments, a width 142 of the recesses 138, 139 ranges from approximately 1 micrometers (um) to approximately 100 um, and a depth 144 of the recesses 138, 139 ranges from approximately 5 um to approximately 200 um. Advantageously, the recesses 138, 139 allows the cap substrate 132 to expand or contract in response to any stress acting upon the cap substrate 132, thereby preventing stress induced deflections on the die 104.

A ball grid array (BGA) 145 underlies the cap substrate 132 on a lower surface 146 of the cap substrate 132. The BGA 145 includes a redistribution layer (RDL) 148 arranged on the lower surface 146 of the cap substrate 132 and electrically coupled to the cap bond pads 136a by one or more second, through substrate vias 150 extending through the cap substrate 132. The RDL 148 is covered by a BGA dielectric layer 152, and under bump metallization (UBM) layers 154 extend through the BGA dielectric layer 152 to electrically couple solder balls 156 underlying the UBM layers 154 to the RDL 148. The BGA dielectric layer 152 may be, for example, an epoxy or a solder masking film (SMF). The RDL 148, the UBM layers 154, the second through substrate vias 150, and the solder balls 156 may be, for example, metals, such as copper, aluminum, and tungsten. The solder balls 156 connect the cap substrate 132 to the device substrate 102.

Figure 1B:
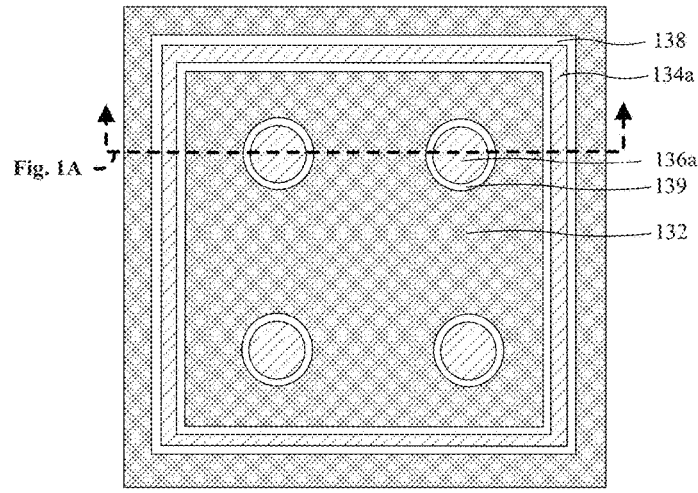
FIG. 1B illustrates a longitudinal view of some embodiments of the WLCSP of FIG. 1A, taken along an upper surface of the cap substrate.

With reference to FIG. 1B, a longitudinal view 100b of some embodiments of the WLCSP 101 along an upper surface of the cap substrate 132 is provided. As illustrated, recesses 138, 139 extend around cap bond pads 136a and along sidewalls of the cap bond ring 134a within the cap substrate 132. Advantageously, the recesses 138, 139 allows the cap substrate 132 to expand or contract in response to stress acting upon the cap substrate 132, thereby preventing stress induced deflections on the die 104 and damage to MEMs devices within the MEMS structure 106. For example, the recesses 138, 139 may mitigate stress on the MEMs structure 106 induced by different thermal expansion coefficients of the WLCSP 101 and the device substrate 102 while soldering the WLCSP 101 to the device substrate 102.

Figure 2:
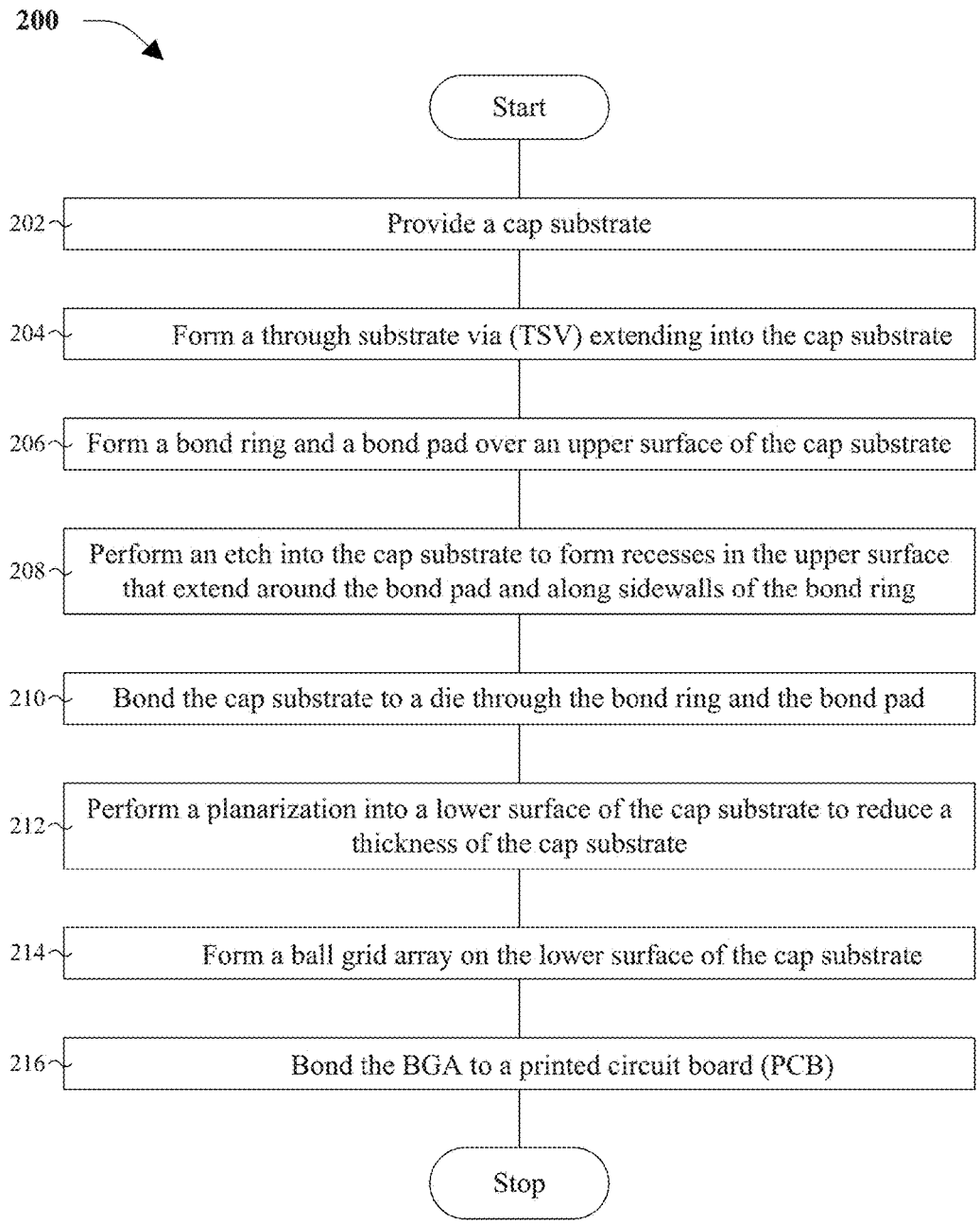
FIG. 2 illustrates a flow chart of some embodiments of a method for manufacturing a WLCSP with a stress absorbing cap substrate.

With reference to FIG. 2, a flowchart 200 provides some embodiments of a method for manufacturing a WLCSP with a stress absorbing cap substrate.

At 202, a cap substrate is provided.

At 204, a TSV is formed extending into the cap substrate.

At 206, a bond ring and a bond pad are formed over an upper surface of the cap substrate.

At 208, an etch is performed into the cap substrate to form recesses in the upper surface that extend around the bond pad and along sidewalls of the bond ring.

At 210, the cap substrate is bonded to a die through the bond ring and the bond pad.

At 212, a planarization is performed into a lower surface of the cap substrate to expose a lower surface of the TSV.

At 214, a BGA is formed on the lower surface of the cap substrate.

At 216, the cap substrate is bonded to a PCB through the BGA.

Advantageously, by etching the cap substrate to form recesses, the cap substrate may expand or contract to absorb stress acting upon the cap substrate. This, in turn, prevents the transfer of stress to the die.

While the method described by the flowchart 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-9, cross-sectional views of some embodiments of a WLCSP at various stages of manufacture are provided to illustrate the method of FIG. 2. Although FIGS. 3-9 are described in relation to the method, it will be appreciated that the structures disclosed in FIGS. 3-9 are not limited to the method, but instead may stand alone as structures independent of the method. Similarly, although the method is described in relation to FIGS. 3-9, it will be appreciated that the method is not limited to the structures disclosed in FIGS. 3-9, but instead may stand alone independent of the structures disclosed in FIGS. 3-9.

Figure 3:
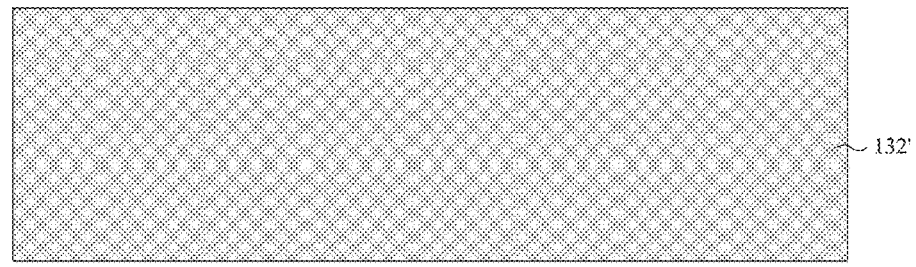
FIGS. 3-9 illustrate a series of cross-sectional views of some embodiments of a WLCSP at various stages of manufacture, according the method of FIG. 2.

FIG. 3 illustrates a cross-sectional view 300 of some embodiments corresponding to Act 202. As illustrated, a cap substrate 132' is provided. The cap substrate 132' may be, for example, a bulk silicon substrate or an SOI substrate.

Figure 4:
Figure 4:
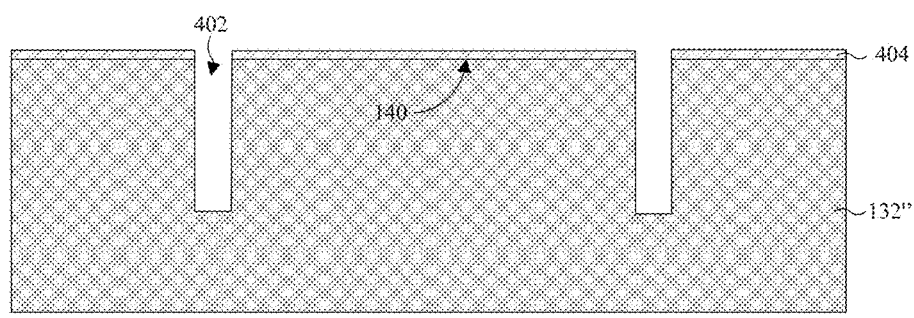
Figure 5:
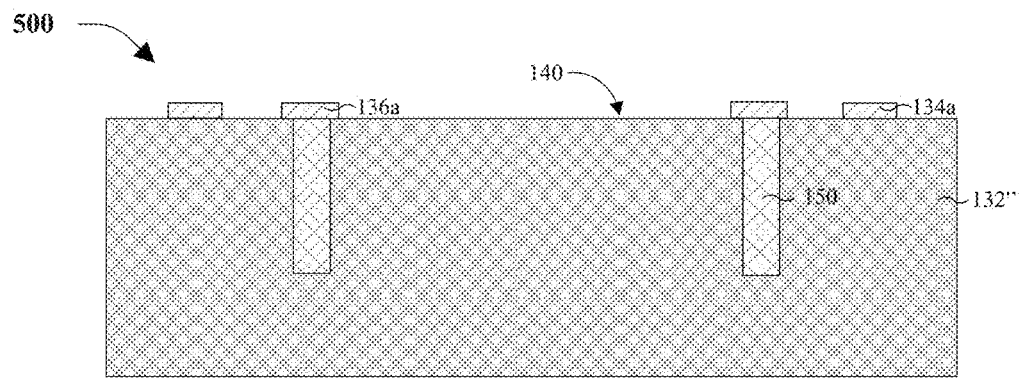

FIGS. 4 and 5 illustrate cross-sectional views 400, 500 of some embodiments corresponding to Acts 204 and 206.

As illustrated by FIG. 4, a first etch is performed into an upper surface 140 of the cap substrate 132' to form one or more openings 402 for forming one or more TSVs. The first etch is typically anistropic and does not extend completely through the cap substrate 132'. In some embodiments, the process for performing the first etch includes forming a first photoresist layer 404 masking regions of the cap substrate 132' surrounding the openings 402. Thereafter, an etchant 406 is applied to the cap substrate 132' according to the first photoresist layer 404 to form the openings 402. Further, the first photoresist layer 404 is removed.

As illustrated by FIG. 5, the openings 402 are filled with a conducting material to form TSVs 150. Also illustrated, a cap bond ring 134a and cap bond pads 136a are formed over the upper surface 140 of the remaining cap substrate 132''. The cap bond ring 134a is formed around the cap bond pads 136a, and the cap bond pads 136a are formed over the TSVs 150. The TSVs 150, the cap bond ring 134a, and the cap bond pads 136a may be formed of, for example, Aluminum (Al), Gold (Au) or Germanium (Ge).

In some embodiments, the process for forming the TSVs 150, the cap bond pads 136a, and the cap bond pads 136a includes forming a first intermediate conductive layer over the remaining cap substrate 132'' and filling the openings 402. A planarization is then performed to the upper surface 140 of the remaining cap substrate 132'', through overlying regions of the first intermediate conductive layer, to form the TSVs 150. Further, a second intermediate conductive layer is formed over the remaining cap substrate 132'' and the TSVs 150. With the second intermediate conductive layer formed, an etch is performed into the second intermediate conductive layer to form the cap bond ring 134a and the cap bond pads 136a. In other embodiments, the process for forming the TSVs 150, the cap bond pads 136a, and the cap bond pads 136a is as above, except that the planarization and the second intermediate conductive layer are omitted. In such embodiments, the etch is performed into the first intermediate conductive layer to form the cap bond pads 136a and the cap bond pads 136a.

Figure 6:
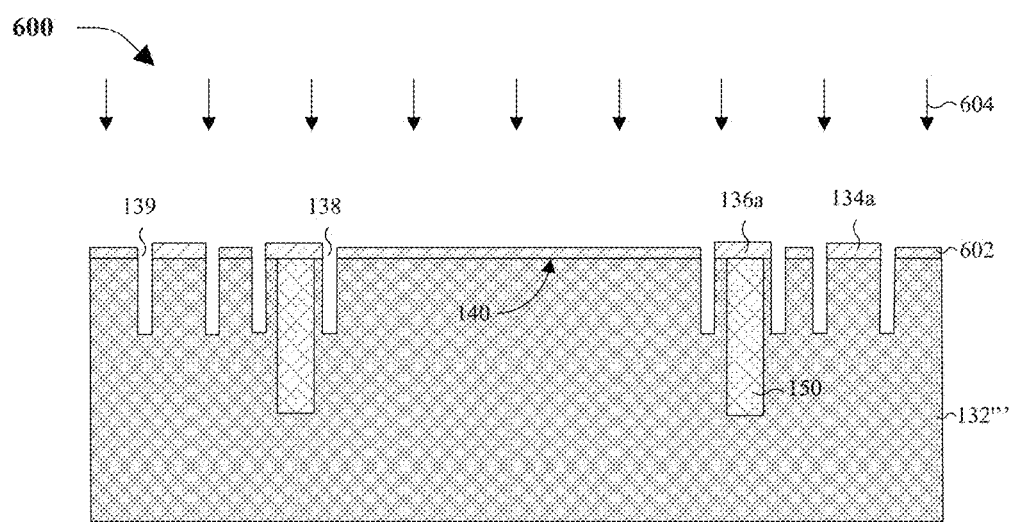

FIG. 6 illustrates a cross-sectional view 600 of some embodiments corresponding to Act 208. As illustrated, a second etch is performed into the remaining cap substrate 132'' to form recesses 138, 139 in the remaining cap substrate 132'' that extend along sidewalls of the cap bond ring 134a and around the cap bond pads 136a. In some embodiments, the recesses 138, 139 have a width ranging from approximately 1 um to approximately 100 um, and a depth ranging from approximately 5 um to approximately 200 um. The second etch is typically anistropic and does not extend completely through the remaining cap substrate 132''. In some embodiments, the process for performing the second etch includes forming a second photoresist layer 602 masking exposed regions of the cap substrate upper surface 140 surrounding the recesses 138, 139, the cap bond ring 134a and the cap bond pads 136a. Thereafter, an etchant 604 is applied to the remaining cap substrate 132'' according to the second photoresist layer 602. Further, the second photoresist layer 602 is removed.

Figure 7:
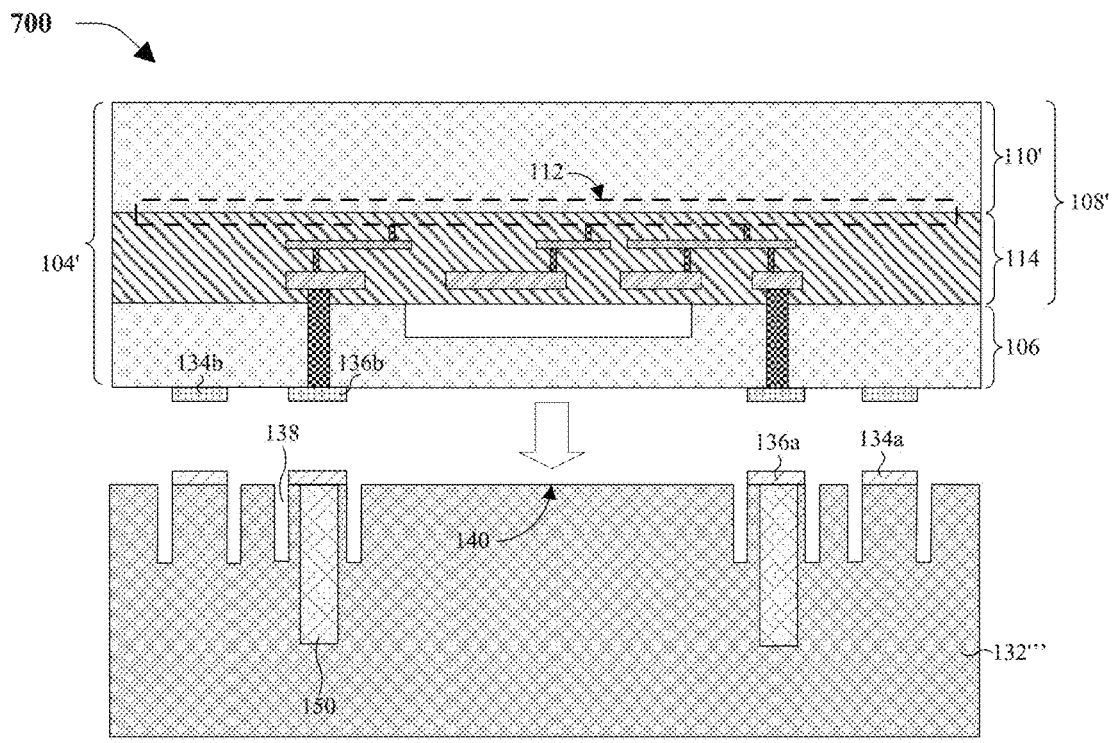

FIG. 7 illustrates a cross-sectional view 700 of some embodiments corresponding to Act 210. As illustrated, the remaining cap substrate 132''' is bonded to a die 104'. In some embodiments, as illustrated, the die 104' includes a MEMS structure 106 and an IC 108' overlying the MEMS structure 106. The IC 108' includes an IC substrate 110', an underlying device region 112 extending into the IC substrate 110', and a BEOL metallization stack underlying the IC substrate 110'. The remaining cap substrate 132''' is bonded with the die 104' through the cap bond pads 136a and the cap bond ring 134a disposed on the upper surface 140 of the remaining cap substrate 132'''. The cap bond ring 134a and the cap bond pads 136a correspondingly bond with a die bond ring 134b and die bond pads 136b on a lower surface of the die 104'. In some embodiments, the bond between the die 104' and the remaining cap substrate 132''' is a eutectic bond.

Figure 8:
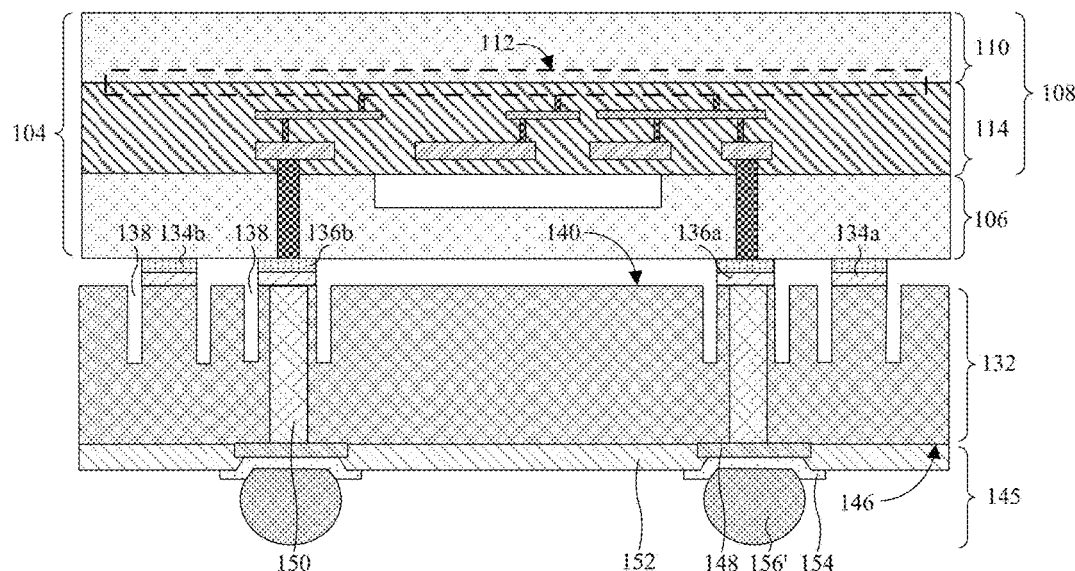

FIG. 8 illustrates a cross-sectional view 800 of some embodiments corresponding to Acts 212 and 214. As illustrated, a planarization is performed into a lower surface 146 of the remaining cap substrate 132''' to expose a lower surface of the TSVs 150. In some embodiments, the planarization is accompanied by a second planarization into a backside of the die 104'. The second planarization may, for example, thin the IC substrate 110'. The one or more planarizations may include, for example, a chemical mechanical polish (CMP).

Also illustrated by FIG. 8, a BGA 145 is formed on the lower surface 146 of the remaining cap substrate 132. The BGA 145 includes an RDL 148 electrically coupled to the metallization layers 116 through the TSV 150. The RDL 148 is covered by a BGA dielectric layer 152, and UBM layers 154 which extend through the BGA dielectric layer 152 to electrically couple solder balls 156' underlying the UBM layers 154 to the RDL 148.

Figure 9:
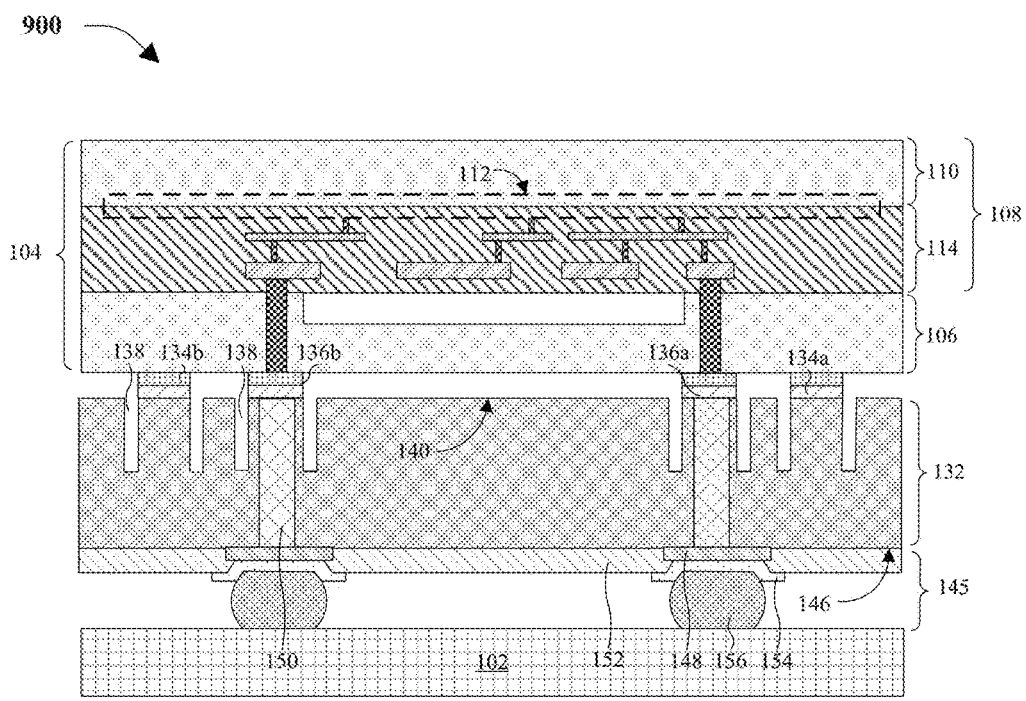

FIG. 9 illustrates a cross-sectional view 900 of some embodiments corresponding to Act 216. As illustrated, a PCB or other substrate 102 is bonded to the remaining cap substrate 132 through the solder balls 156'. In some embodiments, the PCB material includes phenolic cotton paper, or woven glass/epoxy composite.

Figure 10:
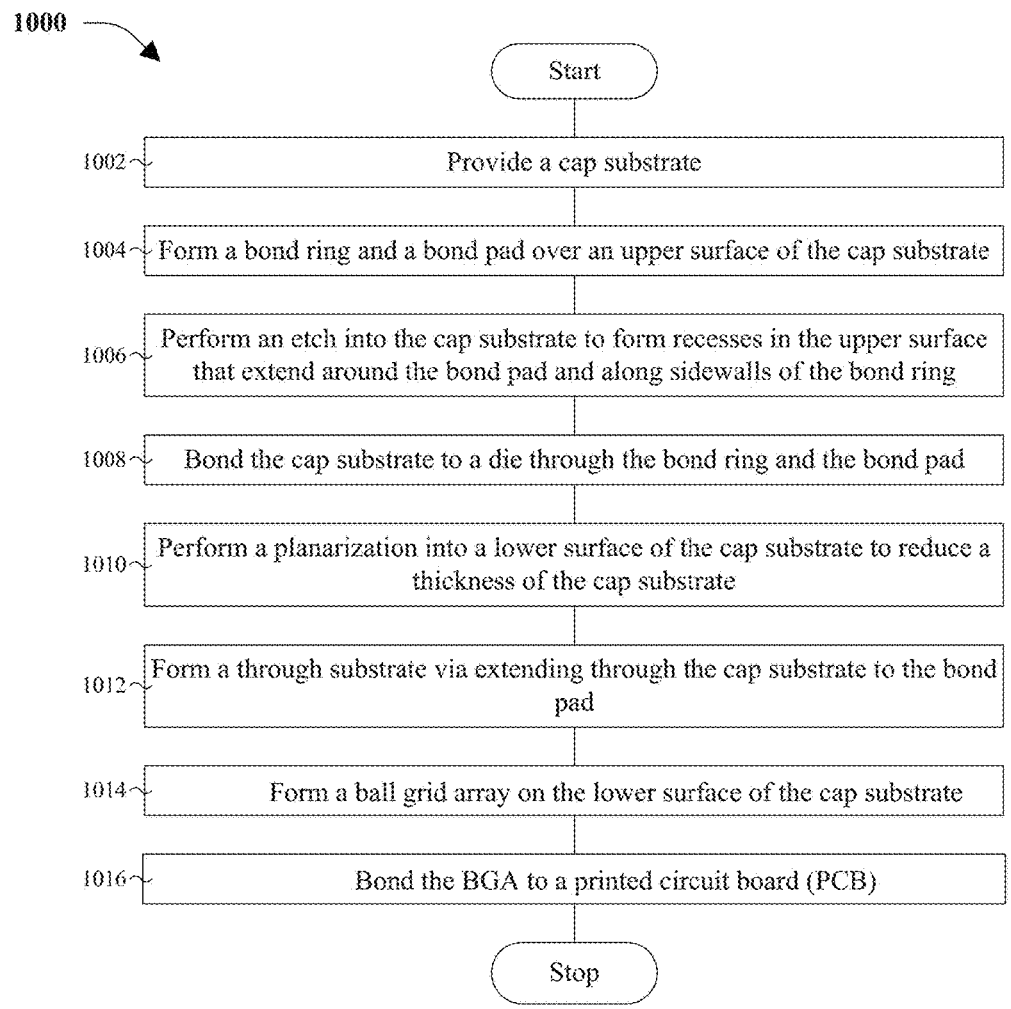
FIG. 10 illustrates a flow chart of other embodiments of a method for manufacturing a WLCSP with a stress absorbing cap substrate.

With reference to FIG. 10, a flowchart 1000 provides other embodiments of a method for manufacturing a WLCSP with a stress absorbing cap substrate. In contrast with the embodiments of FIG. 2, a TSV is formed after bonding a die to a cap substrate.

At 1002, a cap substrate is provided.

At 1004, a bond ring and a bond pad are formed over an upper surface of the cap substrate.

At 1006, an etch is performed into the cap substrate to form recesses in the upper surface that extend around the bond pad and along sidewalls of the bond ring.

At 1008, the cap substrate is bonded to a die through the bond ring and the bond pad.

At 1010, a planarization is performed into a lower surface of the cap substrate to reduce a thickness of the cap substrate.

At 1012, a TSV is formed extending through the cap substrate to the bond pad.

At 1014, a BGA is formed on the lower surface of the cap substrate.

At 1016, the cap substrate is bonded to a PCB through the BGA.

Advantageously, by etching the cap substrate to form recesses, the cap substrate may expand or contract to absorb stress acting upon the cap substrate. This, in turn, prevents the transfer of stress to the die.

While the method described by the flowchart 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 11-17, cross-sectional views of some embodiments of a WLCSP structure at various stages of manufacture are provided to illustrate the method of FIG. 10. Although FIGS. 11-17 are described in relation to the method, it will be appreciated that the structures disclosed in FIGS. 11-17 are not limited to the method, but instead may stand alone as structures independent of the method. Similarly, although the method is described in relation to FIGS. 11-17, it will be appreciated that the method is not limited to the structures disclosed in FIGS. 11-17, but instead may stand alone independent of the structures disclosed in FIGS. 11-17.

Figure 11:
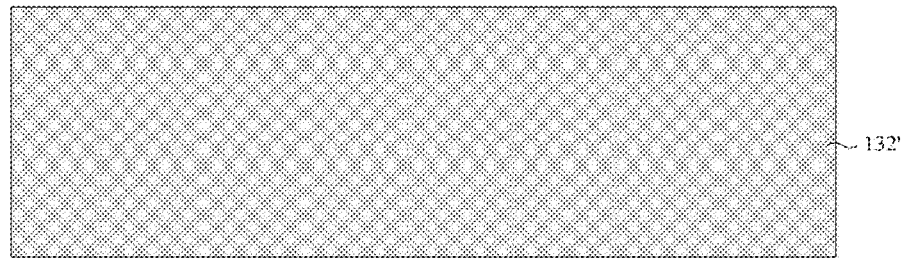
FIGS. 11-17 illustrate a series of cross-sectional views of some embodiments of a WLCSP at various stages of manufacture, according to the method of FIG. 10.

FIG. 11 illustrates a cross-sectional view 1100 of some embodiments corresponding to Act 1002. As illustrated, a cap substrate 132' is provided. The cap substrate 132' may be, for example, a bulk silicon substrate or an SOI substrate.

Figure 12:
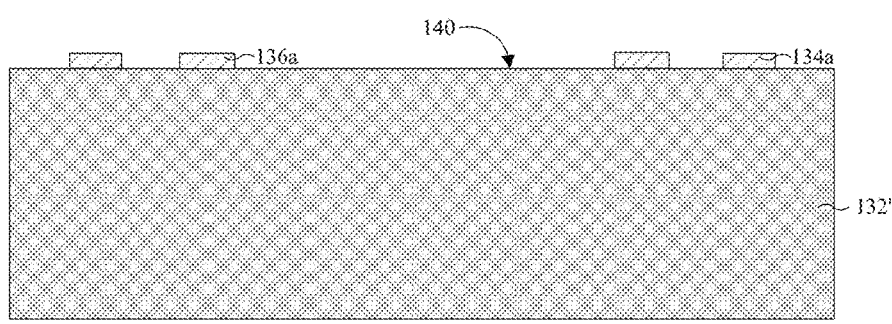

FIG. 12 illustrates a cross-sectional view 1200 of some embodiments corresponding to Act 1004. As illustrated, a cap bond ring 134a and cap bond pads 136a are formed over an upper surface 140 of the cap substrate 132'. The cap bond ring 134a is formed around the cap bond pads 136a. The cap bond ring 134a and the cap bond pads 136a may be formed of, for example, Al, Au, or Ge. In some embodiments, the process for forming the cap bond ring 134a and the cap bond pads 136a includes forming an intermediate conductive layer over the cap substrate 132'. An etch is then performed into the intermediate conductive layer to form the cap bond ring 134a and the cap bond pads 136a.

Figure 13:
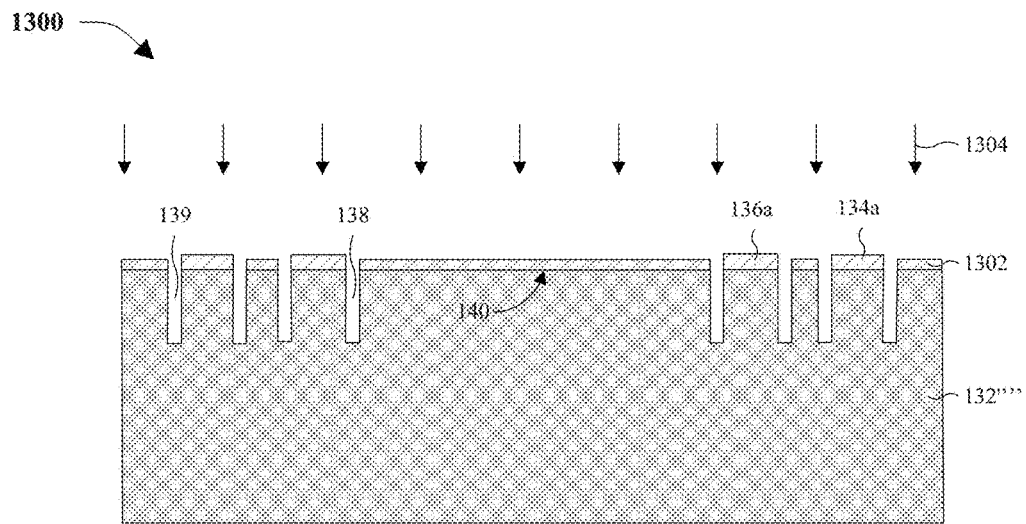

FIG. 13 illustrates a cross-sectional view 1300 of some embodiments corresponding to Act 1006. As illustrated, a first etch is performed into the cap substrate 132' to form recesses 138, 139 in the cap substrate 132' that extend along sidewalls of the cap bond ring 134a and around the cap bond pads 136a. In some embodiments, the recesses 138, 139 have a width ranging from approximately 1 um to approximately 100 um, and a depth ranging from approximately 5 um to approximately 200 um. The first etch is typically anistropic and does not extend completely through the cap substrate 132'. In some embodiments, the process for performing the first etch includes forming a photoresist layer 1302 masking exposed regions of the cap substrate upper surface 140 surrounding the recesses 138, 139, the cap bond ring 134a and the cap bond pads 136a. Thereafter, an etchant 1304 is applied to the cap substrate 132' according to the photoresist layer 1302. Further, the photoresist layer 1302 is removed.

Figure 14:
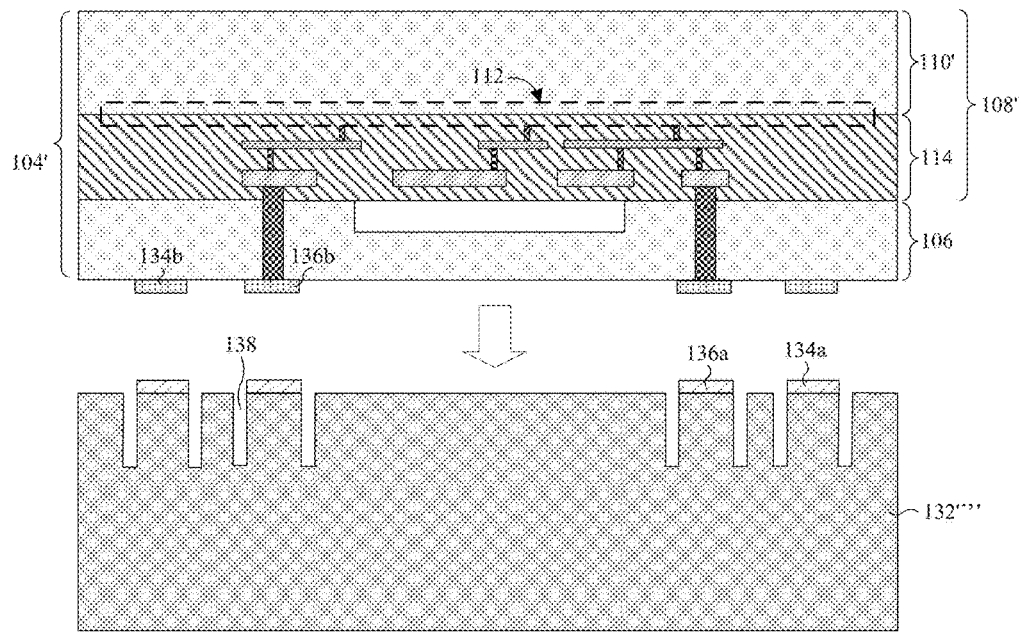

FIG. 14 illustrates a cross-sectional view 1400 of some embodiments corresponding to Act 1008. As illustrated, the remaining cap substrate 132'''' is bonded to a die 104'. In some embodiments, the die 104' includes a MEMS structure 106 and an IC 108' overlying the MEMS structure 106. The IC 108' includes an IC substrate 110', a device region 112 extending into the IC substrate 110', and a BEOL metallization stack underlying the IC substrate 110'. The remaining cap substrate 132'''' is bonded with the die 104' through the cap bond pads 136a and the cap bond ring 134a. The cap bond ring 134a and the cap bond pads 136a correspondingly bond with a die bond ring 134b and die bond pads 136b on the die 104'. In some embodiments, the bond between the die 104' and the remaining cap substrate 132'''' is a eutectic bond.

Figure 15:
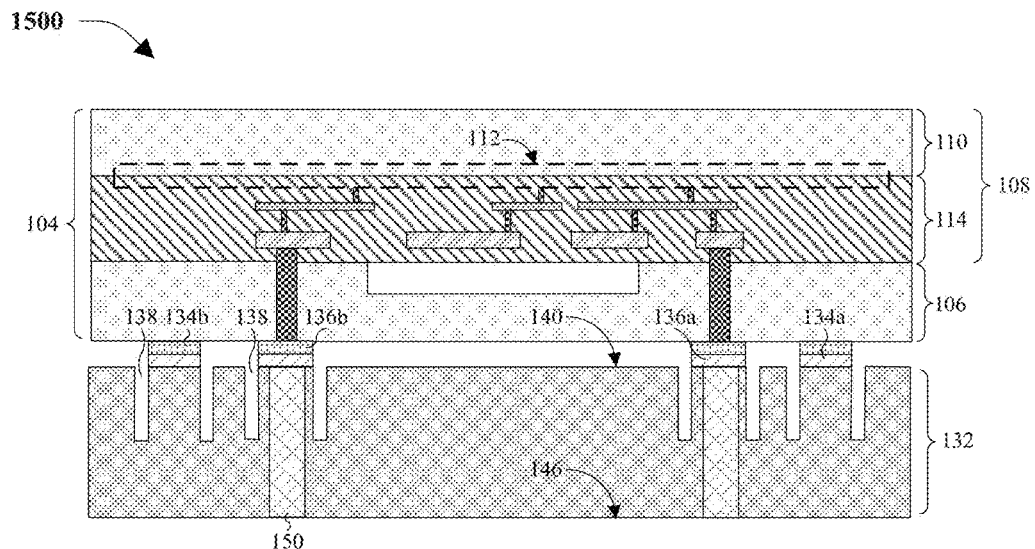

FIG. 15 illustrates a cross-sectional view 1500 of some embodiments corresponding to Acts 1010 and 1012. As illustrated, a planarization is performed into a lower surface 146 of the remaining cap substrate 132'''' to reduce a thickness of the remaining cap substrate 132''''. In some embodiments, the planarization is accompanied by a second planarization into a backside of the die 104'. The second planarization may, for example, thin the IC substrate 110'. The one or more planarizations may include, for example, a CMP.

Also illustrated by FIG. 15, TSVs 150 are formed extending through the remaining cap substrate 132'''' to the cap bond pads 136a. In some embodiments, the process for forming the TSVs 150 includes performing an etch into the lower surface 146 of the remaining cap substrate 132'''' to form openings (not shown) extending to the cap bond pads 136a. Following the etch, the openings are filled with a conductive material.

Figure 16:
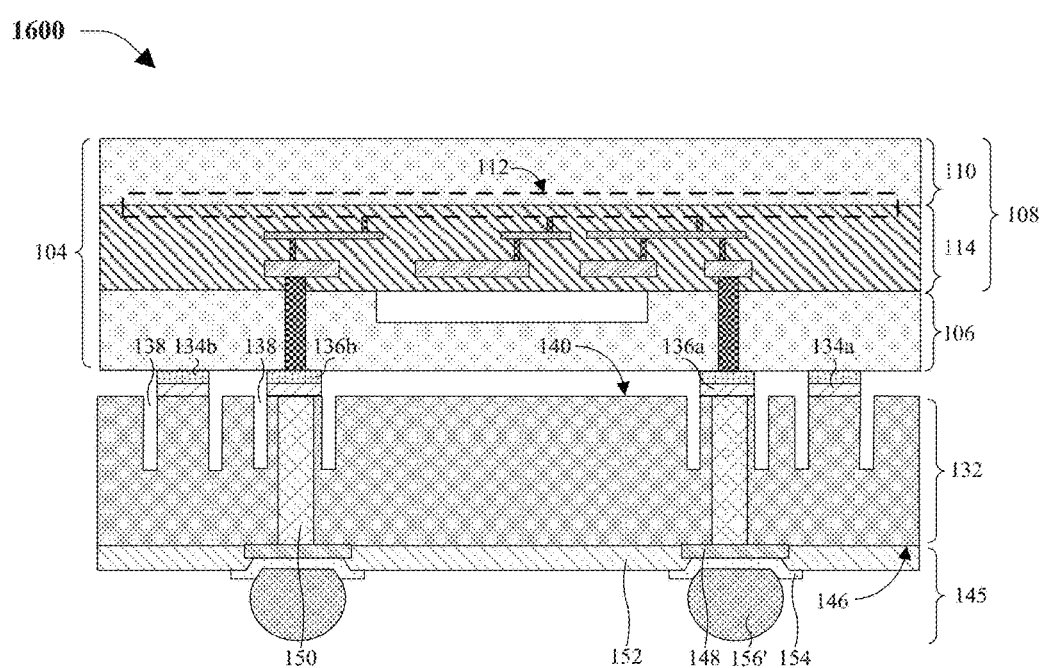

FIG. 16 illustrates a cross-sectional view 1600 of some embodiments corresponding to Act 1014. As illustrated, a BGA 145 is formed on the lower surface 146 of the remaining cap substrate 132. The BGA 145 includes an RDL 148 electrically coupled to the metallization layers 116 through the TSV 150. The RDL 148 is covered by a BGA dielectric layer 152, and UBM layers 154 which extend through the BGA dielectric layer 152 to electrically couple solder balls 156' underlying the UBM layers 154 to the RDL 148.

Figure 17:
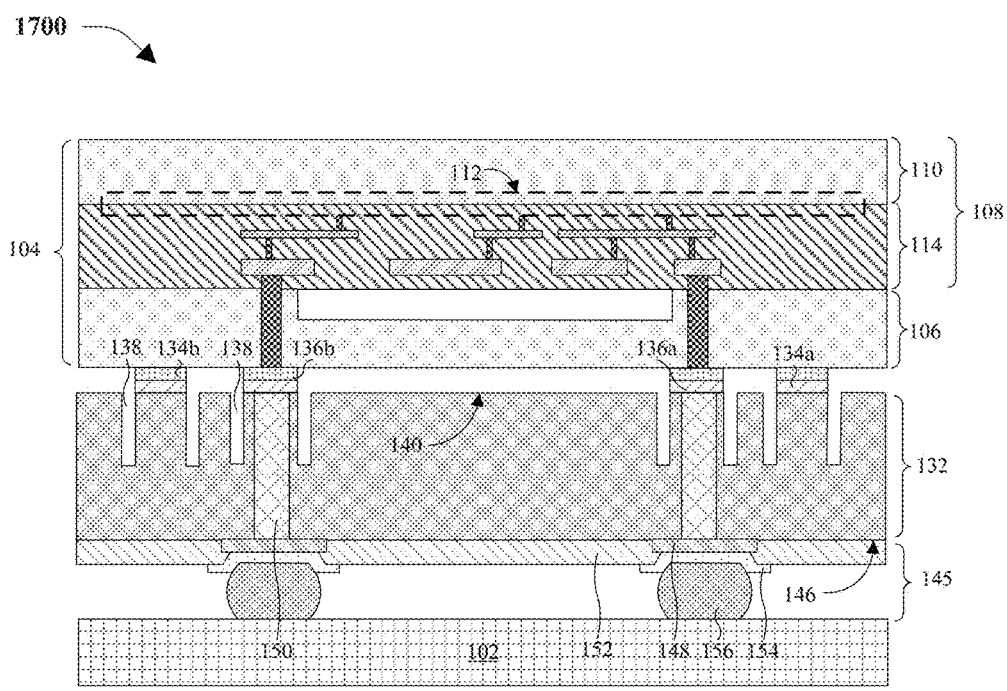

FIG. 17 illustrates a cross-sectional view 1700 of some embodiments corresponding to Act 1016. As illustrated, a PCB or other substrate 102 is bonded to the remaining cap substrate 132 through the solder balls 156'.

Thus, as can be appreciated from above, the present disclosure provides a WLCSP. A cap substrate is bonded to a die through a bond ring and a bond pad arranged on an upper surface of the cap substrate. A TSV extends from the bond pad, through the cap substrate, to a lower surface of the cap substrate. Recesses in the upper surface extend around the bond pad and along sidewalls of the bond ring.

In other embodiments, the present disclosure provides a method for forming a WLCSP. A cap substrate is provided. A bond ring and a bond pad are formed over an upper surface of the cap substrate. The bond ring is formed around the bond pad. An etch is performed into the cap substrate to form recesses in the upper surface that extend around the bond pad and along sidewalls of the bond ring. The cap substrate is bonded to a die through the bond ring and the bond pad. A TSV is formed extending into the cap substrate from about even with the upper surface.

In yet other embodiments, the present disclosure relates to a MEMS package. A MEMS structure is bonded to an integrated circuit. A cap substrate is bonded to the MEMS structure and the integrated circuit through a bond ring and bond pads arranged on an upper surface of the cap substrate. A TSV is arranged within the cap substrate. The TSV extends through the cap substrate from the bond pads. Recesses in the upper surface extend around the bond pads and along sidewalls of the bond ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer level chip scale package (WLCSP) comprising:
    a die;
    a cap substrate having a pad recess and a ring recess that extend into an uppermost surface of the cap substrate;
    one or more bonding elements including a bond pad and a bond ring, wherein the bond pad and the bond ring are arranged on the uppermost surface of the cap substrate and are configured to bond the die to the cap substrate, wherein the ring recess has a ring recess sidewall and the bond ring has a bond ring sidewall, and wherein the ring recess sidewall and the bond ring sidewall are collinear and vertically separated by the uppermost surface of the cap substrate; and
    a through substrate via (TSV) extending through the cap substrate and configured to provide an electrical connection between the die and underlying solder balls disposed below a lower surface of the cap substrate.

2. The WLCSP of claim 1, wherein the solder balls comprise:
    a ball grid array (BGA) disposed between the cap substrate and a printed circuit board and electrically coupled to the TSV.

3. The WLCSP of claim 2, wherein the BGA includes:
    a redistribution layer (RDL) disposed along the lower surface of the cap substrate;
    a BGA dielectric layer arranged under and around the RDL;
    an under bump metallization (UBM) layer underlying the BGA dielectric layer and extending through the BGA dielectric layer to the RDL; and
    a solder bump underlying the UBM layer and electrically coupled to the RDL by the UBM layer.

4. The WLCSP of claim 1, further including:
    a eutectic bond between the cap substrate and the die.

5. The WLCSP of claim 1, wherein the die includes a microelectromechanical systems (MEMS) structure, the MEMS structure corresponding to one of an accelerometer, a magnetic sensor, a gyroscope, a pressure sensor, a magnetic sensor, and a radiofrequency (RF) resonator.

6. The WLCSP of claim 1, wherein the die includes:
    a microelectromechanical systems (MEMS) structure; and
    an integrated circuit coupled to the MEMS structure, wherein the integrated circuit comprises a semiconductor substrate having one or more semiconductor devices and an underlying inter-level dielectric layer comprising a plurality of metal interconnect layers.

7. The WLCSP of claim 6, wherein the MEMS structure includes a flexible membrane abutting a cavity hermetically sealed between the MEMS structure and the integrated circuit.

8. A microelectromechanical systems (MEMS) package, comprising:
    an integrated circuit comprising a semiconductor substrate having one or more semiconductor devices and an underlying inter-level dielectric (ILD) layer comprising a plurality of metal interconnect layers;
    a MEMS structure bonded to the ILD layer;
    a cap substrate bonded to the MEMS structure through a bond ring and a bond pad arranged on an uppermost surface of the cap substrate, wherein the bond ring and the bond pad are metallic, wherein the cap substrate has recesses including a pad recess and a ring recess, wherein the pad recess is arranged around the bond pad in a continuous, closed path, wherein the ring recess is arranged around the pad recess, along the bond ring, wherein the pad recess is independent of the ring recess, and wherein the uppermost surface is continuous from the pad recess to the ring recess; and
    a through substrate via (TSV) arranged within the cap substrate, wherein the TSV extends through the cap substrate from the bond pad and is separated from the pad recess by a region of the cap substrate;
    wherein the pad recess and the ring recess extend into the uppermost surface of the cap substrate, wherein the ring recess has a ring recess sidewall and the bond ring has a bond ring sidewall, and wherein the ring recess sidewall and the bond ring sidewall are collinear and vertically separated by the uppermost surface of the cap substrate.

9. The package of claim 8, wherein the recesses have a width ranging from approximately 1 micrometers (um) to approximately 100 um, and a depth ranging from approximately 5 um to approximately 200 um.

10. The package of claim 8, further comprising:
    a cavity hermetically sealed between the MEMS structure and the ILD layer, wherein sidewalls of the MEMS structure respectively define sidewalls of the cavity, and wherein a bottom surface of the ILD layer and a recessed surface of the MEMS structure respectively define a top surface of the cavity and a bottom surface of the cavity.

11. The package of claim 10, wherein the recessed surface of the MEMS structure is recessed below a planar interface between the ILD layer and the MEMS structure.

12. The package of claim 8, further comprising:
an additional TSV extending from contact with a metal interconnect layer of the plurality of metal interconnect layers, through the MEMS structure, to contact with another bond pad on the uppermost surface of the cap substrate.

13. The package of claim 8, wherein the recesses are ring-shaped, wherein the cap substrate defines bottom surfaces respectively of the recesses, and wherein the bottom surfaces respectively of the recesses are vertically spaced between the uppermost surface of the cap substrate and a lowermost surface of the cap substrate.

14. The package of claim 13, further comprising:
a ball grid array (BGA) arranged on the lowermost surface of the cap substrate, wherein the TSV extends from contact with the bond pad, through the cap substrate, to contact with the BGA.

15. A microelectromechanical systems (MEMS) package, comprising:
an integrated circuit (IC) comprising a semiconductor substrate, a dielectric layer, and metallization layers, wherein the dielectric layer is under the semiconductor substrate, and wherein the metallization layers are stacked within the dielectric layer;
a MEMS structure under and bonded to the IC at an interface between the dielectric layer and the MEMS structure;
a cavity between the MEMS structure and the dielectric layer;
a capping substrate under and bonded to the MEMS structure through an uppermost surface of the capping substrate;
a pair of bond pads stacked between the capping substrate and the MEMS structure;
a pair of bond rings stacked between the capping substrate and the MEMS structure, wherein the bond rings laterally enclose the bond pads, and wherein the pair of bond rings and the pair of bond pads are metallic;
a first through via extending from contact with a metallization layer of the IC, through the MEMS structure, to contact with a top one of the bond pads; and
a second through via extending from contact with a bottom one of the bond pads, through the capping substrate, to a bottom surface of the capping substrate;
wherein the capping substrate comprises a pad recess laterally enclosing one of the bond pads, and extending vertically into the uppermost surface of the capping substrate, wherein the bottom one of the bond pads has a sidewall aligned with a sidewall of the pad recess that is defined by the capping substrate, and wherein the second through via is separated from the pad recess by a region of the capping substrate.

16. The MEMS package of claim 15, wherein the capping substrate comprises a pair of additional recesses extending vertically into the uppermost surface of the capping substrate, and respectively extending conformally along inner and outer sidewalls of the bond rings; and
wherein the inner and outer sidewalls of the bond rings are vertically separated from the pair of additional recesses by the uppermost surface of the cap substrate.

17. The MEMS package of claim 16, wherein the pad recess and the additional recesses are ring-shaped.

18. The MEMS package according to claim 17, wherein bottom surfaces respectively of the pad recess and the additional recesses are defined by the capping substrate and are vertically spaced between the uppermost surface of the capping substrate and the bottom surface of the capping substrate.

19. The MEMS package according to claim 15, wherein the bond pad has a pair of bond pad sidewall segments and the pad recess has a pair of pad recess sidewall segments, wherein the bond pad sidewall segments are respectively on opposite sides of the bond pad and are vertically separated from the pad recess sidewall segments by the uppermost surface of the cap substrate, and wherein the bond pad sidewall segments are respectively aligned with the pad recess sidewall segments.

20. The MEMS package according to claim 15, further comprising:
a ball grid array (BGA) arranged on the bottom surface of the capping substrate, wherein the second through via extends from contact with the bottom one of the bond pads, through the capping substrate, to contact with the BGA.

* * * * *